United States Patent
Biber

(10) Patent No.: US 9,013,186 B2
(45) Date of Patent: Apr. 21, 2015

(54) LOCAL COIL FOR MAGNETIC RESONANCE APPLICATIONS

(75) Inventor: Stephan Biber, Frauenaurach (DE)

(73) Assignee: Siemens Aktiengesellschaft, München (DE)

(*) Notice: Subject to any disclaimer, the term of this patent is extended or adjusted under 35 U.S.C. 154(b) by 540 days.

(21) Appl. No.: 13/458,944

(22) Filed: Apr. 27, 2012

(65) Prior Publication Data

US 2013/0106419 A1 May 2, 2013

(30) Foreign Application Priority Data

Apr. 29, 2011 (DE) .......... 10 2011 017 800

(51) Int. Cl.
*G01R 33/34* (2006.01)
*G01R 33/36* (2006.01)
*G01R 33/3415* (2006.01)

(52) U.S. Cl.
CPC ............ *G01R 33/34* (2013.01); *G01R 33/3692* (2013.01); *G01R 33/3415* (2013.01)

(58) Field of Classification Search
USPC ................................................. 324/300–322
See application file for complete search history.

(56) References Cited

U.S. PATENT DOCUMENTS

| 5,497,773 | A | * | 3/1996 | Kuhara et al. | 600/421 |
| 5,722,409 | A | * | 3/1998 | Kuhara et al. | 600/410 |
| 6,954,666 | B2 | * | 10/2005 | Bechtold et al. | 600/410 |
| 7,173,426 | B1 | | 2/2007 | Bulumulla et al. | |
| 7,310,437 | B2 | * | 12/2007 | Oosawa | 382/132 |
| 7,729,470 | B2 | * | 6/2010 | Fischer et al. | 378/37 |
| 7,729,744 | B2 | * | 6/2010 | Falco et al. | 600/427 |

FOREIGN PATENT DOCUMENTS

DE     10 2006 056 453 A1    5/2007

OTHER PUBLICATIONS

German Office Action dated Dec. 20, 2011 for corresponding German Patent Application No. DE 10 2011 017 800.7 with English translation.
S. Martius, et al., "Wireless Local Coil Signal Transmission Using a Parametric Upconverter," Proc. Intl. Soc. Mag. Reson. Med. 17, p. 2934, 2009.
M. J. Riffe, et al., "Using On-board Microprocessors to Control a Wireless MR Receiver Array," Proc. Intl. Soc. Mag. Reson. Med. 17, p. 2936, 2009.

* cited by examiner

*Primary Examiner* — Dixomara Vargas
(74) *Attorney, Agent, or Firm* — Lempia Summerfield Katz LLC

(57) ABSTRACT

A local coil includes a transmitter, to which magnetic resonance signals are supplied and which modulates a carrier signal oscillating at a carrier frequency using the magnetic resonance signals. The local coil includes a transmitting antenna, to which the modulated carrier signal is supplied and which sends the modulated carrier signal in a beam to a control and evaluation device of a magnetic resonance system. The beam has a mean direction of radiation. In a vertical plane containing the mean direction of radiation, the beam covers a vertical angle, and in a transverse plane containing the mean direction of radiation and running orthogonally to the vertical plane, the beam covers a transverse angle. The local coil includes an adjusting device that adjusts the mean direction of radiation independently of the orientation of the local coil relative to the vertical.

20 Claims, 4 Drawing Sheets

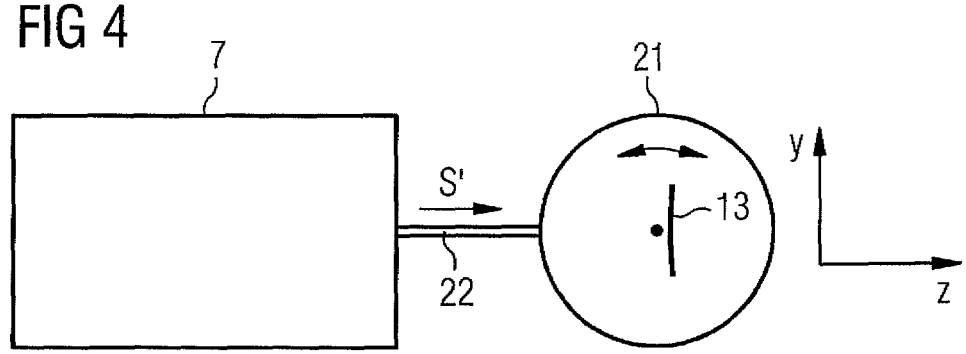
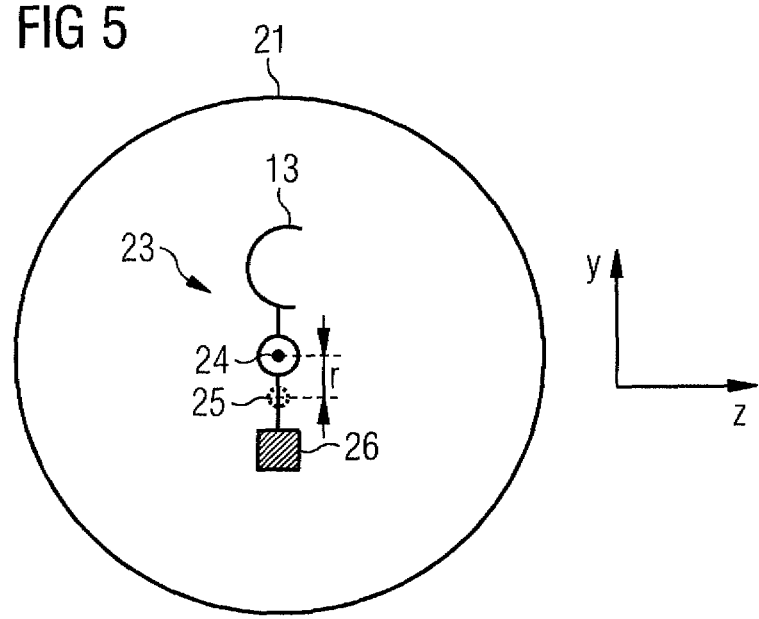

LOCAL COIL FOR MAGNETIC RESONANCE APPLICATIONS

This application claims the benefit of DE 10 2011 017 800.7, filed on Apr. 29, 2011.

BACKGROUND

The present embodiments relate to a local coil for magnetic resonance applications, Images with a high signal-to-noise ratio (SNR) may be recorded in magnetic resonance imaging using local coils. Local coils are antenna systems that are provided in the immediate vicinity on top of (anterior) or underneath (posterior) the object to be examined (frequently a patient). During the magnetic resonance measurement, the nuclei excited to form magnetic resonances induce a voltage in the individual antennae of the local coil. The induced voltage is amplified by a low noise amplifier (LNA) and forwarded to a receiving electronic device. To improve the signal-to-noise ratio in high resolution images, high field units that have a base magnetic field of 1.5 Tesla and above and sometimes even above 12 Tesla may be used.

One measure for improving the SNR lies in arranging the receiving antennae as close as possible to the object to be examined. In some cases, the SNR may also be increased by reducing the size of the receiving antenna (optimized loop diameter). This is very helpful, for example, for applications in which tissue close to the surface is being examined.

In the prior art, the received magnetic resonance signal may be transmitted to a control and evaluation device of the magnetic resonance system via wires. The wired transmission is regarded as being disadvantageous. The reasons for this include, for example, the time required for handling the cables, inserting the connectors, the costs required for the connectors and cables, and patient safety (e.g., sheath waves).

The received magnetic resonance signals are converted to a different frequency and transmitted wirelessly by way of a radio link to the control and evaluation device.

In research in the field of magnetic resonance systems, efforts are currently being made to digitize the magnetic resonance signal before transmitting the magnetic resonance signal from the local coil to the control and evaluation device. Only a few receiving antennae are required on the part of the control and evaluation device (e.g., in the patient tunnel).

One drawback of transmitting the magnetic resonance signal via a radio link is, for example, the problems of correctly orienting the transmitting antenna of the local coil (e.g., the antenna that forwards the received magnetic resonance signal to the control and evaluation device). If the transmitting antenna is not aligned, greater demands are consequently made on the quality of the transmission path. The quality of the transmission path is critical, since, otherwise, reliable transmission from the local coil to the control and evaluation device is not possible. High path losses may occur, for example, in the case of disadvantageous constellations such that, even in the case of a digital transmission, the bit error rate (BER) is so high that the radio link collapses and may not be used.

No solutions to these problems are known in practice. Various research approaches do exist, however. Reference will be made to the following:

"Wireless Local Coil Signal Transmission Using a Parametric Upconverter" by Sebastian Martius, Oliver Heid, Markus Vester, Stephan Biber and Juergen Nistler, ISMRM 2009, Poster 2934, and "Using On-Board Microprocessors to Control a Wireless MR Receiver Array" by Matthew J. Riffe, Jeremiah A. Heilmann, Natalia Gudino and Mark A. Griswold, ISMRM 2009, Poster 2936.

Wireless video area networks (WVANs) are also known. WVANs may operate at frequencies in the range of about 60 GHz. Antenna arrays, in which the transmitting antenna is directly and automatically oriented by a search function, and a bidirectional communications protocol to the receiving antenna or the link is established via a secondary reflector in the room (e.g., by reflection on the wall), are used. Drawbacks of these methods, however, are that dedicated solutions are not available, or are only available to a limited extent, for the industrial and medical markets. Other drawbacks include that high investment expenditure is required and that bidirectional communication and control of the antenna beam in two orientations is complex.

SUMMARY AND DESCRIPTION

The present embodiments may obviate one or more of the drawbacks or limitations in the related art. For example, a local coil for magnetic resonance applications, in which a reliable and stable wireless data transmission from the local coil to a control and evaluation device of the magnetic resonance system, is provided.

In a local coil for magnetic resonance applications, a transmitting antenna sends a modulated carrier signal in a beam to a control and evaluation device of a magnetic resonance system. The beam has a mean direction of radiation. In a vertical plane containing the mean direction of radiation, the beam covers a vertical angle, and in a transverse plane containing the mean direction of radiation and running orthogonally to the vertical plane, the beam covers a transverse angle. The local coil includes an adjusting device that adjusts the mean direction of radiation independently of the orientation of the local coil relative to the vertical such that the mean direction of radiation forms a predetermined polar angle (e.g., a right angle) with the vertical.

For example, in the case where the predetermined polar angle is a right angle, the mean direction of radiation lies in the horizontal.

The vertical angle and the transverse angle may also be determined, as required. For example, the vertical angle and the transverse angle may be the same size (e.g., both may be about 30°). The transverse angle may be greater than the vertical angle, however. For example, the vertical angle may be 20° to 60°, and the transverse angle may be at least 90° (e.g., 120° to 150°).

In one embodiment, the transmitting antenna is arranged in a radome, and the adjusting device orients the transmitting antenna relative to the vertical to adjust the mean direction of radiation.

Orientation of the transmitting antenna may be brought about by way of a suitable drive (e.g., a pneumatic drive). In one embodiment, the transmitting antenna is a component of a transmitting assembly. The transmitting assembly is mounted so as to be pivotal about a horizontal axis arranged inside the radome. The center of mass of the transmitting assembly has a radial spacing from the horizontal axis, so the transmitting antenna is oriented purely passively relative to the vertical.

If the transverse angle is large enough, in some cases, only the polar angle may be adjusted, but transversely thereto, there is no re-adjustment of the beam. In some embodiments, orientation of the beam in the horizontal plane (e.g., about the vertical direction) is also required, however.

In one embodiment, the transmitting assembly may be mounted so as to be pivotal about a transverse axis arranged inside the radome and running orthogonally to the horizontal axis. The transmitting assembly may include an element arranged at a radial spacing from the transverse axis. The element is made from a weakly magnetic material, so the transmitting antenna is oriented purely passively relative to the base magnetic field of a magnetic resonance scanner. This embodiment is advantageous, for example, if the transmitting assembly may be positioned at a sufficient spacing from the receiving antennae.

For orientation of the beam in the horizontal direction, the transmitting antenna includes a plurality of antenna elements. The modulated carrier signal is supplied to the antenna elements with a respective phase shift. The antenna elements are arranged such that, viewed around the vertical, the mean direction of radiation is dependent on the phase shifts. The local coil includes a rotary orientation detection device, using which a rotary orientation of the local coil relative to a horizontally running base magnetic field of a magnetic resonance scanner is detected. The phase shifts are determined as a function of the rotary orientation of the local coil.

The rotary orientation of the local coil relative to the horizontally running base magnetic field of the magnetic resonance scanner may be detected, for example, by Hall sensors.

As an alternative to a mechanical orientation of the transmitting antenna, the transmitting antenna includes a plurality of antenna elements. The modulated carrier signal is supplied to the plurality of antenna elements with a respective phase shift. The plurality of antenna elements are arranged such that the polar angle is dependent on the phase shifts. The local coil includes a gradient detection device, by which the gradient of the local coil relative to the vertical is detected. The phase shifts are determined as a function of the gradient of the local coil.

To detect the gradient of the local coil, the gradient detection device may include magnetic field sensors to detect a horizontally running base magnetic field of a magnetic resonance scanner and/or gyroscope.

In some cases, only the polar angle may be adjusted accordingly. However, the antenna elements may be arranged such that with a constant polar angle, the mean direction of radiation, viewed around the vertical, is also dependent on the phase shifts. The local coil includes a rotary orientation detection device, by which a rotary orientation of the local coil relative to the horizontal running base magnetic field of the magnetic resonance scanner is detected. The phase shifts are also determined as a function of the rotary orientation of the local coil.

The gradient detection device and the rotary orientation detection device may be configured as a combined device (e.g., when magnetic field sensors are used).

In one embodiment of the local coil, the local coil includes an antenna body, in which the transmitting antenna is arranged, and the antenna body is connected to the remainder of the local coil by a flexible connecting cable. This measure results in simple rough positioning of the transmitting antenna, for example. An element made of weakly magnetic material that is used for orienting the transmitting antenna in the horizontal plane may be positioned with sufficient spacing from the receiving antennae of the local coil.

The magnetic resonance signals are received by the receiving antennae as analog signals. The magnetic resonance signals may be forwarded to the control and evaluation device as analog signals. The local coil may include an analog-to-digital converter, using which the magnetic resonance signals are digitized before being supplied to the transmitter.

The carrier frequency may be determined as required. The carrier frequency may be at least 10 GHz. In one embodiment, the carrier frequency may be 20 GHz, 60 GHz to 70 GHz, or up to 100 GHz.

BRIEF DESCRIPTION OF THE DRAWINGS

FIG. 4 diagrammatically shows one embodiment of a local coil having a radome and a transmitting antenna;

FIG. 5 diagrammatically shows one embodiment of a transmitting antenna arranged in a radome;

DETAILED DESCRIPTION OF THE DRAWINGS

Figure 1:
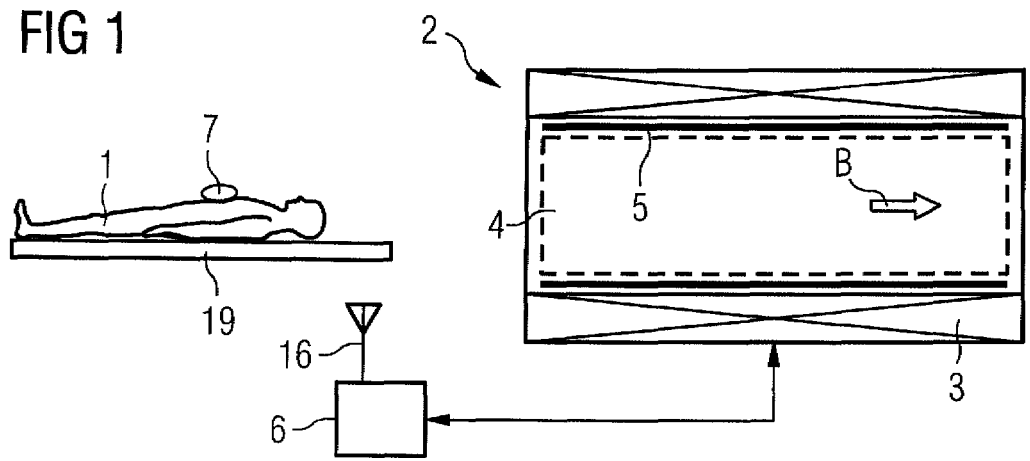
FIG. 1 diagrammatically shows one embodiment of a magnetic resonance CT scanner.

According to FIG. 1, an object 1 (e.g., a person) is to be examined in a magnetic resonance CT scanner 2. The magnetic resonance CT scanner 2 includes, for example, a base magnet 3. The base magnet 3 generates a strong (e.g., 1.5 T and above) static base magnetic field B that is locally substantially homogeneous inside an examination volume 4 and is horizontally directed. The base magnet 3 may be annularly designed, so the base magnet 3 forms a tunnel (e.g., a patient tunnel). The patient tunnel substantially matches the examination volume 4.

The magnetic resonance CT scanner 2 also includes a whole body coil 5, by which high frequency excitation pulses may be applied to the examination volume 4. If the object 1 to be examined is situated in the examination volume 4, the object 1 to be examined is excited by the excitation pulses to emit magnetic resonance signals. The whole body coil 5 and further elements of the magnetic resonance CT scanner 2 (e.g., a gradient coil system not shown in the figure) are controlled by a control and evaluation device 6 of the magnetic resonance CT scanner 2.

The magnetic resonances excited in the object 1 to be examined may be detected by a local coil 7 (or optionally, a plurality of local coils 7). The local coil 7 may be configured, for example, as a head coil, a knee coil, a chest coil, an eye coil, or any other coil. According to FIG. 2, the local coil 7 includes a plurality of receiving antennae 8, by which the local coil 7 receives the magnetic resonance signals excited in the object 1 to be examined. The receiving antennae 8 are tuned for this purpose to the appropriate Larmor frequency that, for example, with a base magnetic field B of 3 T and the detection of protons, is about 127 MHz. The received magnetic resonance signals are analog signals and are received by the receiving antennae 8 as such.

The received magnetic resonance signals may be digitized in the local coil 7. The local coil 7 includes at least one analog-to-digital converter 9. In one embodiment, at least one amplifier 10 may be arranged between the receiving antennae 8 and the analog-to-digital converter 9.

Figure 2:
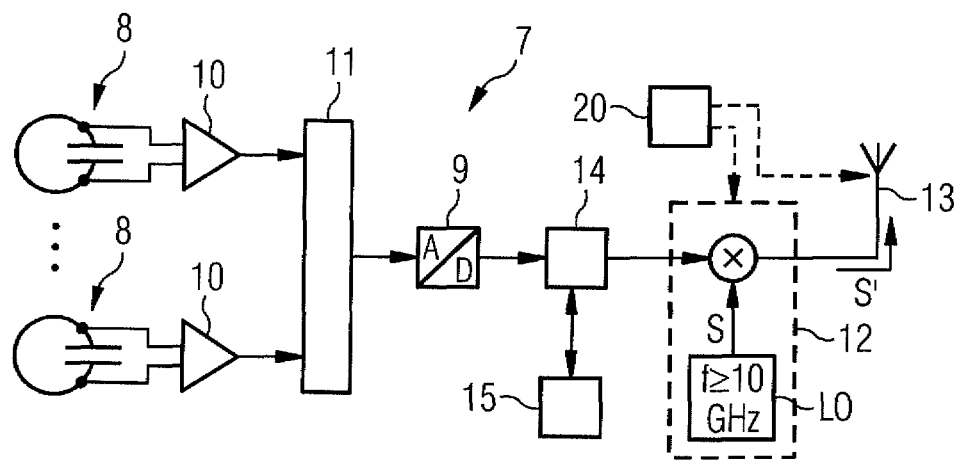
FIG. 2 diagrammatically shows the construction of one embodiment of a local coil.

If the local coil 7 includes a plurality of receiving antennae 8 according to the diagram in FIG. 2, each receiving antenna 8 may have a separate amplifier 10 and/or a separate analog-to-digital converter 9. A multiplexer 11 may be arranged upstream of the analog-to-digital converter 9 according to the diagram in FIG. 2, so at least the analog-to-digital converter 9 digitizes the magnetic resonance signals of a plurality of receiving antennae 8. In one embodiment, the multiplexer 11 may be arranged upstream of the amplifier 10, so the amplifier 10 may amplify the magnetic resonance signals (e.g., sequentially one after the other) of a plurality of receiving antennae 8.

The magnetic resonance signals are transmitted (e.g., in analog or in digital form) from the local coil 7 to the control and evaluation device 6. Transmission occurs via a transmitter 12 with subsequent transmitting antenna 13. The magnetic resonance signals are supplied to the transmitter 12. The magnetic resonance signals of the transmitter may be supplied directly from the receiving antennae 8 or the analog-to-digital converter 9. The local coil 7 may include an electronic control device 14 that is arranged between the receiving antennae 8 or the analog-to-digital converter 9 and the transmitter 12. A buffer 15, in which the magnetic resonance signals are buffered, may be associated with the electronic control device 14.

A carrier signal S is supplied to the transmitter 12 (e.g., from an oscillator LO that oscillates at a carrier frequency f). The carrier frequency f may be determined as required. In one embodiment, the carrier frequency f may be at least 10 GHz. For example, the carrier frequency f may be at least 20 GHz (e.g., 55 GHz to 70 GHz). Even higher frequencies may be used.

The transmitter 12 modulates the carrier signal S with the magnetic resonance signal supplied to the transmitter 12 and supplies the modulated carrier signal (hereinafter provided with the reference character S' to distinguish the modulated carrier signal from the unmodulated carrier signal S) to the transmitting antenna 13. The transmitting antenna 13 sends the modulated carrier signal S' to the control and evaluation device 6. The control and evaluation device 6 receives the modulated carrier signal S'. The control and evaluation device 6 includes at least one receiving antenna 16 for this purpose, according to FIG. 1.

Figure 3:
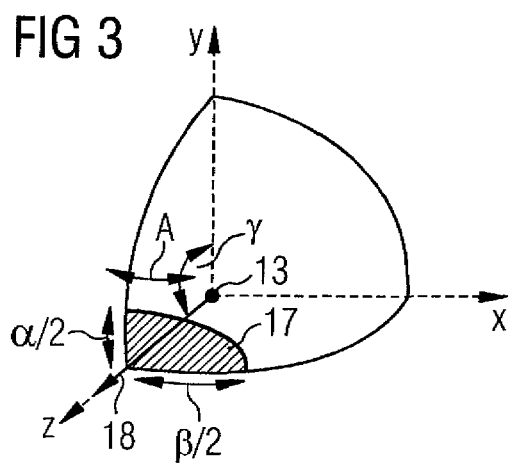
FIG. 3 diagrammatically shows an exemplary radiation characteristic.

The transmitting antenna 13 does not send the modulated carrier signal S' in all possible directions. Owing to the high carrier frequency f, the modulated carrier signal S' is radiated in a beam 17. The beam 17 has (see FIG. 3) a mean direction of radiation 18. FIG. 3 diagrammatically shows an octant of a right-handed, right-angled Cartesian coordinate system with the coordinates x, y and z. The coordinates x and z lie, according to FIG. 3, in the horizontal plane. The coordinate y defines the vertical. The transmitting antenna 13 is arranged in the origin of the coordinate system.

According to FIG. 3, the mean direction of radiation 18 is located in the horizontal. For example, the mean direction of radiation 18 points in the direction of the z axis. Neither is important within the framework of the description of the radiation characteristics of the transmitting antenna 13, however. What is important is the vertical direction (e.g., the y axis) and the mean direction of radiation 18 (e.g., the z axis) as such.

The vertical direction and the mean direction of radiation 18 define a vertical plane (e.g., according to FIG. 3, the yz plane). In the vertical plane, the beam 17 covers a vertical angle α. Since only an octant of a sphere is shown, FIG. 3 shows only half the vertical angle α/2. The (complete) vertical angle α may have a relatively low value (e.g., 20° to 60°).

The mean direction of radiation 18 and the vertical direction define a normal direction that is orthogonal to the mean direction of radiation 18 and orthogonal to the vertical direction (e.g., the x direction). The mean direction of radiation 18 and the normal direction define a transverse plane that runs orthogonally to the vertical plane (e.g., the xz plane according to FIG. 3). In the transverse plane, the beam 17 covers a transverse angle β. Analogous to the vertical angle α, only half of the transverse angle β/2 is shown in FIG. 3.

For some embodiments, the (complete) transverse angle β is approximately or exactly as large as or is smaller than the vertical angle α. In some embodiments, the transverse angle β has a greater value than the vertical angle α. For example, the transverse angle β may be at least 90 (e.g., 120° to 150°).

The local coil 7 is arranged on the object 1 to be examined or on an examination table 19 (see FIG. 1). The local coil 7 does not always have the same position and/or orientation. The beam 17 is directed at the receiving antenna 16 of the control and evaluation device 6 (e.g., strikes the receiving antenna 16, irrespective of the position and orientation of the local coil 7). The beam 17 may always be directed at the receiving antenna 16. The local coil 7, according to FIG. 2, includes an adjusting device 20. The adjusting device 20 adjusts the mean direction of radiation 18 relative to the vertical, such that the mean direction of radiation 18 forms a predetermined polar angle γ with the vertical and, more precisely, irrespective of the position and orientation of the local coil 7. The adjusting device 20 may, as shown in broken lines in FIG. 2, alternatively act on the transmitter 12 or the transmitting antenna 13. The adjusting device 20 may also be controlled by the electronic control device 14. This is purely optional, however, and not necessary.

The polar angle γ may be chosen as desired. In one embodiment, the polar angle γ may be 0° (or 180°), so the mean direction of radiation 18 is identical to the vertical. The polar angle γ is not 0° (or 180°), however. For example, the polar angle γ may be 90°, so the mean direction of radiation 18 runs in the horizontal plane.

To adjust the polar angle γ, the adjusting device 20 may act on the transmitting antenna 13 (e.g., orients the transmitting antenna 13 relative to the vertical). The transmitting antenna 13, according to FIG. 4, may, for example, be arranged in a radome 21 in this case (e.g., if the transmitting antenna 13 is mechanically moved). In one embodiment, the radome 21 may, as shown in FIG. 4, be spherical or partially spherical. The radome 21 has sufficient stability and dimensioning, so the transmitting antenna 13 may be oriented or may orient itself inside the radome 21. The radome 21 is transparent for the modulated carrier signal S' emitted by transmitting antenna 13.

The radome 21 corresponds with an antenna body, in which the transmitting antenna 13 is arranged. The antenna body 21 may be connected to the remainder of the local coil 7 by a flexible connecting cable 22. This embodiment results in various advantages in the design of the local coil 7 and adjusting device 20. This applies even though the connecting cable 22 may be relatively short (e.g., 2 cm to 20 cm, where the length of the connecting cable 22 may be between 4 cm and 15 cm).

As shown in FIG. 5, the transmitting antenna 13 is a component of a transmitting assembly 23. The transmitting assembly 23 is mounted so as to be pivotal about a horizontal axis 24. The horizontal axis 24 is arranged inside the radome 21.

The transmitting assembly 23 has a center of mass 25. The center of mass 25 has a radial spacing r from the horizontal axis 24. By way of example, the transmitting assembly 23 may have a loading weight 26, as a result of which the center of mass 25 is influenced accordingly. The radial spacing r of the center of mass 25 from the horizontal axis 24 provides that the transmitting antenna 13 is oriented purely passively relative to the vertical. Neither sensors for detecting the gradient of the local coil 7 in relation to the vertical direction, nor actuators for actively orienting the transmitting antenna 13 are required. The ability to pivot about the horizontal axis 24 is sufficiently straightforward.

The above-described process provides that, viewed in the vertical plane, the beam 17 is correctly oriented. Orientation is not, in all cases, viewed in the horizontal plane. This applies, for example, if the transverse angle β of the beam 17 is sufficiently large (e.g., at least 90°; 120° to 150°). If orientation of the beam 17 is also provided in the horizontal plane, this may be achieved in accordance with the embodiment in FIG. 6 or in accordance with the embodiment in FIG. 7.

Figure 6:
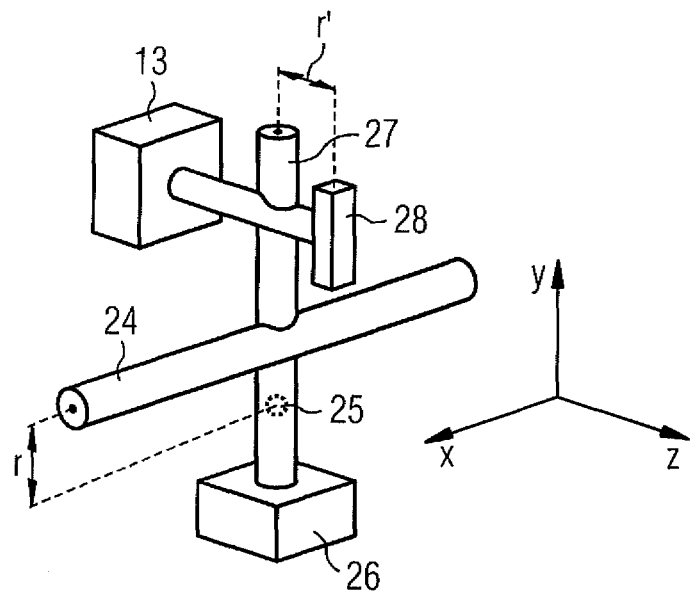
FIG. 6 diagrammatically shows one embodiment of the transmitting antenna arranged in the radome shown in FIG. 5.

According to FIG. 6, the transmitting assembly 23, in addition to the pivotal mounting about the horizontal axis 24, may be mounted so as to be pivotal about a transverse axis 27. The transverse axis 27 is also arranged inside the radome 21 (not shown in FIG. 6) and runs orthogonally to the horizontal axis 24. The transmitting assembly 23 is therefore gimbal mounted. In this case, the transmitting assembly 23, according to FIG. 6, includes an element 28 that is made from a weakly magnetic material and is arranged at a radial spacing r' from the transverse axis 27.

Owing to the element 28, the transmitting antenna 13 orients itself, if the transmitting antenna 13 is located in the examination volume 4 of the magnetic resonance CT scanner 2, like a weather vane in the wind using the base magnetic field B of the magnetic resonance CT scanner 2. Analogously to the orientation in the vertical direction, orientation occurs purely passively (e.g., without requiring sensors or actuators). FIG. 6 shows an orientation directly in the direction of the z axis. This diagram is purely exemplary, however. Any desired orientation is possible in the horizontal plane (e.g., in the x direction or in the direction of the angle bisector between the x direction and the z-direction).

Figure 7:
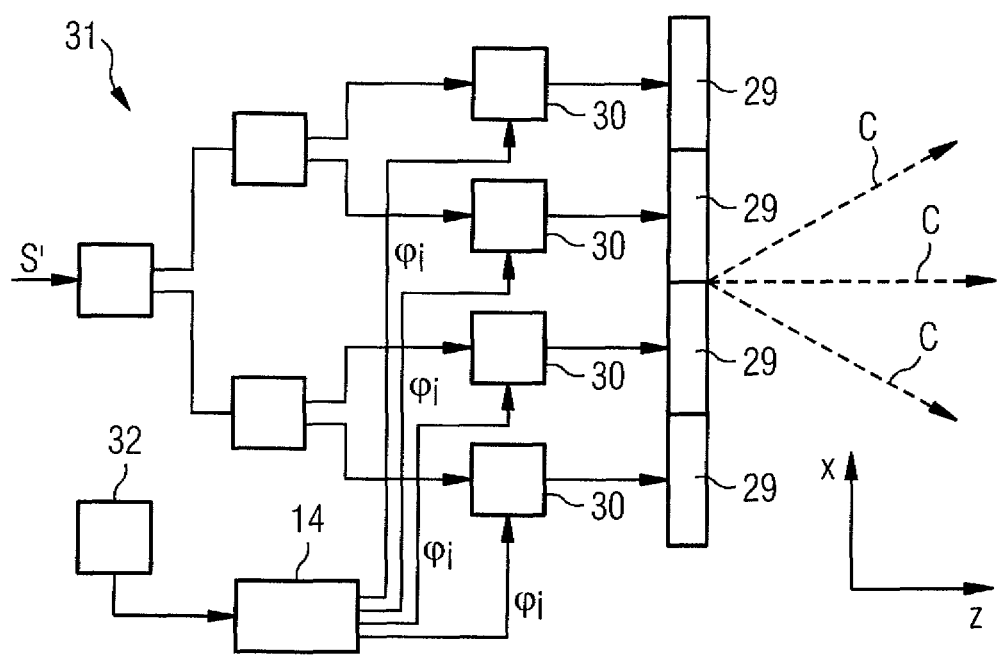
FIG. 7 diagrammatically shows one embodiment of a process for orienting a beam.

Alternatively, according to FIG. 7, the transmitting antenna 13 may include a plurality of antenna elements 29. FIG. 7 shows four antenna elements 29. The illustrated number is purely exemplary, however.

One phase adjusting member 30 respectively is arranged upstream of each of the antenna elements 29 (e.g., with the exception of a single antenna element 29). A signal splitting device 31 is arranged upstream of the phase adjusting members 30. In the embodiment according to FIG. 7, the modulated carrier signal S' is split in the signal splitting device 31 into a plurality of signal components. The signal components are equal in magnitude. The corresponding signal component is supplied to each antenna element 29. The respective signal components are delayed in the phase adjusting members 30 by a respective phase shift $\phi_i$. The respective phase shift $\phi_i$ is specified (e.g., individually for the respective phase adjusting member 30) to the corresponding phase adjusting members 30 by the electronic control device 14.

In the case of the embodiment according to FIG. 7, the antenna elements 29 are arranged such that, with a constant polar angle γ, the mean direction of radiation 18, viewed around the vertical, depends on the phase shifts $\phi_i$. For example, the antenna elements 29 may be arranged side by side for this purpose. With a polar angle γ of 90°, for example, the beam 17 may therefore be oriented in the horizontal plane by appropriate specification of the phase shifts $\phi_i$. FIG. 3 indicates this by way of a double arrow A.

In the embodiment according to FIG. 7, the local coil 7 includes a rotary orientation detection device 32. A rotary orientation of the local coil 7 (in the horizontal plane) relative to the horizontal running base magnetic field B of the magnetic resonance CT scanner 2 is detected by the rotary orientation detection device 32. For this purpose, the rotary orientation detection device 32 may, for example, include appropriate magnetic field sensors (e.g., Hall sensors).

The rotary orientation detection device 32 supplies the rotary orientation that the rotary orientation detection device 32 has detected to the electronic control device 14. The electronic control device 14 determines the phase shifts $\phi_i$ as a function of the rotary orientation, with which the electronic control device 14 is supplied. Whether the mean direction of radiation 18 is oriented directly in the z direction or whether the mean direction of radiation 18 includes a positive or negative x component in addition to a z component may be established, for example. This is indicated in FIG. 7 by correspondingly broken-line arrows C.

Figure 8:
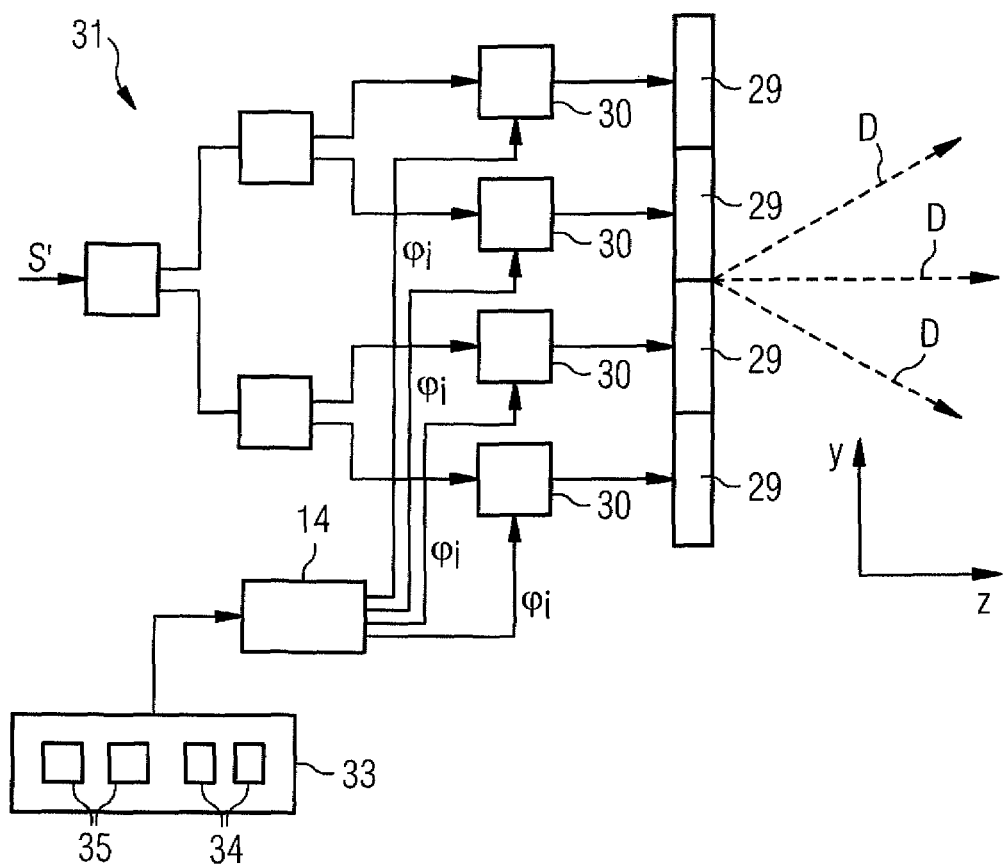
FIG. 8 diagrammatically shows another embodiment of a process for orienting a beam.

To adjust the predetermined polar angle γ, according to FIG. 8, the radiation characteristic of the transmitting antenna 13 may be electronically influenced as an alternative to mechanical orientation of the transmitting antenna 13. Analogous to FIG. 7, in the embodiment according to FIG. 8, the transmitting antenna 13 also includes a plurality of antenna elements 29. Phase adjustment members 30 and a signal splitting device 31 are again arranged upstream of the antenna elements 29. Analogous to FIG. 7, the respective phase shift $\phi_i$ is specified by the electronic control device 14 to the phase adjusting members 30.

However, in contrast to FIG. 7, the antenna elements 29 are arranged such that the polar angle γ is dependent on the phase shifts $\phi_i$. For example, the antenna elements 29 may be arranged one above the other for this purpose.

According to FIG. 8, the local coil 7 includes a gradient detection device 33. The gradient of the local coil 7 relative to the vertical is detected by the gradient detection device 33. The gradient detection device 33 may include gyroscopes 34 and/or magnetic field sensors 35, for example, for this purpose. Within the scope of the present embodiments, magnetic field sensors 35 only operate properly if the magnetic field sensors 35 are arranged in the base magnetic field B of the magnetic resonance CT scanner 2. This is due to the fact that the magnetic field sensors 35 are to detect the horizontal base magnetic field B. This is harmless, however, since within the scope of the present embodiments, it is only during this period that the corresponding orientation of the beam 17 is important.

The gradient detection device 33 supplies the gradient of the local coil 7 the gradient detection device 33 has detected to the electronic control device 14. As a function of the gradient, with which the electronic control device 14 has been supplied, the electronic control device 14 determines the individual phase shifts $\phi_i$ for the phase adjustment members 30 and supplies the phase adjusting members 30 with the phase shifts $\phi_i$. The polar angle γ is adjusted as a result (see corresponding arrows D in FIG. 8).

Figure 9:
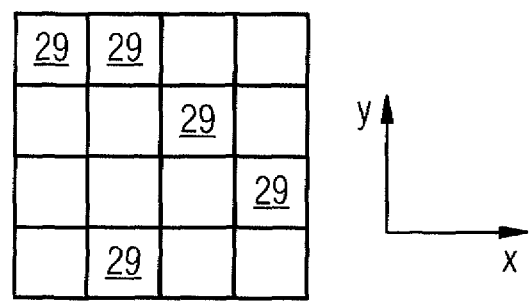
FIG. 9 shows a front view of one embodiment of a transmitting antenna.

The embodiment in FIG. 8 may be combined with the embodiment in FIG. 7. In this case, the antenna elements 29 are arranged such that, in addition to the polar angle γ, the mean direction of radiation 18, viewed around the vertical direction, may also depend on the phase shifts $\phi_i$. For example, the antenna elements 29 may form a two-dimensional matrix for this purpose (see FIG. 9). The rotary orientation detection device 32 is also present in this case, in addition to the gradient detection device 33. If the gradient detection device 33 works with magnetic field sensors 35, the gradient detection device 33 and the rotary orientation detection device 32 may also be combined to form a unit.

In the case of combination of the embodiments of FIGS. 7 and 8, the electronic control device 14 determines the phase shifts $\phi_i$ as a function of the gradient of the local coil 7 and as a function of the rotary orientation.

The present embodiments have many advantages. For example, it is very easy to achieve a defined orientation of the beam 17 despite almost any orientation of the local coil 7. Application is problem-free, since thin objects (e.g., a blanket, with which the object 1 to be examined is covered) are still penetrated by the modified carrier signal S' without problems. Bidirectional communication between the control and evaluation device 6 and the local coil 7 is not necessary for orientation of the beam 17.

The above description serves solely to explain the present embodiments. By contrast, the scope of the present invention shall be determined solely by the accompanying claims.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for magnetic resonance applications, the local coil comprising:
   a plurality of receiving antennae operable to receive magnetic resonance signals excited by an excitation signal in an object to be examined;
   a transmitter, to which the magnetic resonance signals are supplied, the transmitter operable to modulate a carrier signal oscillating at a carrier frequency using the magnetic resonance signals;
   a transmitting antenna, to which the modulated carrier signal is supplied, the transmitting antenna operable to send the modulated carrier signal in a beam to a control and evaluation device of a magnetic resonance system,
   wherein the beam has a mean direction of radiation,
   wherein in a vertical plane containing the mean direction of radiation, the beam covers a vertical angle and in a transverse plane containing the mean direction of radiation and running orthogonally to the vertical plane, the beam covers a transverse angle, and
   wherein the local coil further comprises an adjusting device that always adjusts the mean direction of radiation independently of an orientation of the local coil relative to the vertical such that the mean direction of radiation forms a predetermined polar angle with the vertical.

2. The local coil as claimed in claim 1, wherein the predetermined polar angle with the vertical is a right angle.

3. The local coil as claimed in claim 1, wherein the transverse angle is greater than the vertical angle.

4. The local coil as claimed in claim 1, wherein the transmitting antenna is arranged in a radome, and
   wherein to adjust the mean direction of radiation, the adjusting device is operable to orient the transmitting antenna relative to the vertical.

5. The local coil as claimed in claim 4, wherein the transmitting antenna is a component of a transmitting assembly, the transmitting assembly being mounted so as to be pivotal about a horizontal axis arranged inside the radome, and
   wherein the center of mass of the transmitting assembly has a radial spacing from the horizontal axis, so the transmitting antenna is oriented purely passively relative to the vertical.

6. The local coil as claimed in claim 5, wherein the transmitting assembly is also mounted so as to be pivotal about a transverse axis arranged inside the radome and running orthogonally to the horizontal axis, and
   wherein the transmitting assembly comprises an element arranged at a radial spacing from the transverse axis, the element being made of a weakly magnetic material, so the transmitting antenna is oriented purely passively relative to a base magnetic field of a magnetic resonance scanner.

7. The local coil as claimed in claim 4, wherein the transmitting antenna comprises a plurality of antenna elements, the modulated carrier signal being supplied to the plurality of antenna elements with a respective phase shift, the plurality of antenna elements being arranged such that with the predetermined polar angle being constant, the mean direction of radiation, viewed around the vertical, is dependent on the phase shifts,
   wherein the local coil further comprises a rotary orientation detection device operable to detect a rotary orientation of the local coil relative to a horizontally running base magnetic field of a magnetic resonance scanner, and
   wherein the phase shifts are determined as a function of the rotary orientation of the local coil.

8. The local coil as claimed in claim 1, wherein the transmitting antenna comprises a plurality of antenna elements, the modulated carrier signal being supplied to the plurality of antenna elements with a respective phase shift, the antenna elements being arranged such that the predetermined polar angle is dependent on the plurality of phase shifts,
   wherein the local coil further comprises a gradient detection device operable to detect a gradient of the local coil relative to the vertical, and
   wherein the phase shifts are determined as a function of the gradient of the local coil.

9. The local coil as claimed in claim 8, wherein the gradient detection device comprises magnetic field sensors for detecting a horizontally running base magnetic field of a magnetic resonance scanner, a gyroscope, or the magnetic resonance scanner and the gyroscope.

10. The local coil as claimed in claim 8, wherein the plurality of antenna elements is arranged such that, viewed around the vertical, the mean direction of radiation is dependent on the phase shifts,
    wherein the local coil further comprises a rotary orientation detection device operable to detect a rotary orientation of the local coil relative to a horizontally running base magnetic field of a magnetic resonance scanner, and
    wherein the phase shifts are determined as a function of the rotary orientation the local coil.

11. The local coil as claimed in claim 1, wherein the local coil further comprises an antenna body, in which the transmitting antenna is arranged, and
    wherein the antenna body is connected by a flexible connecting cable to the remainder of the local coil.

12. The local coil as claimed in claim 1, wherein the magnetic resonance signals are received as analog signals, and
    wherein the local coil further comprises an analog-to-digital converter operable to digitize the magnetic resonance signals before being supplied to the transmitter.

13. The local coil as claimed in claim 1, wherein the carrier frequency is at least 10 GHz.

14. The local coil as claimed in claim 2, wherein the transmitting antenna is arranged in a radome, and
- wherein to adjust the mean direction of radiation, the adjusting device is operable to orient the transmitting antenna relative to the vertical.

15. The local coil as claimed in claim 5, wherein the transmitting antenna comprises a plurality of antenna elements, the modulated carrier signal being supplied to the plurality of antenna elements with a respective phase shift, the plurality of antenna elements being arranged such that with the predetermined polar angle being constant, the mean direction of radiation, viewed around the vertical, is dependent on the phase shifts,
- wherein the local coil further comprises a rotary orientation detection device operable to detect a rotary orientation of the local coil relative to a horizontally running base magnetic field of a magnetic resonance scanner, and
- wherein the phase shifts are determined as a function of the rotary orientation of the local coil.

16. The local coil as claimed in claim 2, wherein the transmitting antenna comprises a plurality of antenna elements, the modulated carrier signal being supplied to the plurality of antenna elements with a respective phase shift, the antenna elements being arranged such that the predetermined polar angle is dependent on the plurality of phase shifts,
- wherein the local coil further comprises a gradient detection device operable to detect a gradient of the local coil relative to the vertical, and
- wherein the phase shifts are determined as a function of the gradient of the local coil.

17. The local coil as claimed in claim 9, wherein the plurality of antenna elements is arranged such that, viewed around the vertical, the mean direction of radiation is dependent on the phase shifts,
- wherein the local coil further comprises a rotary orientation detection device operable to detect a rotary orientation of the local coil relative to a horizontally running base magnetic field of a magnetic resonance scanner, and
- wherein the phase shifts are determined as a function of the rotary orientation the local coil.

18. The local coil as claimed in claim 2, wherein the local coil further comprises an antenna body, in which the transmitting antenna is arranged, and
- wherein the antenna body is connected by a flexible connecting cable to the remainder of the local coil.

19. The local coil as claimed in claim 2, wherein the magnetic resonance signals are received as analog signals, and
- wherein the local coil further comprises an analog-to-digital converter operable to digitize the magnetic resonance signals before being supplied to the transmitter.

20. The local coil as claimed in claim 2, wherein the carrier frequency is at least 10 GHz.

\* \* \* \* \*